US010545563B2

(12) United States Patent
Kiyozaki

(10) Patent No.: US 10,545,563 B2
(45) Date of Patent: Jan. 28, 2020

(54) METHODS AND APPARATUS FOR POWER MANAGEMENT OF A MEMORY CELL

(71) Applicant: SEMICONDUCTOR COMPONENTS INDUSTRIES, LLC, Phoenix, AZ (US)

(72) Inventor: Kenichi Kiyozaki, Mizuho (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 340 days.

(21) Appl. No.: 15/487,551

(22) Filed: Apr. 14, 2017

(65) Prior Publication Data

US 2018/0299939 A1    Oct. 18, 2018

(51) Int. Cl.
*G06F 1/324*    (2019.01)
*G06F 1/3296*   (2019.01)
*G06F 1/3234*   (2019.01)
*G11C 11/417*   (2006.01)
*G11C 5/14*     (2006.01)

(52) U.S. Cl.
CPC ............ *G06F 1/324* (2013.01); *G06F 1/3275* (2013.01); *G06F 1/3296* (2013.01); *G11C 5/147* (2013.01); *G11C 11/417* (2013.01)

(58) Field of Classification Search
CPC ...... G06F 1/324; G06F 1/3296; G06F 1/3275; G11C 11/417; G11C 5/147
See application file for complete search history.

(56) References Cited

U.S. PATENT DOCUMENTS

| | | | | |
|---|---|---|---|---|
| 7,092,281 B1* | 8/2006 | Aipperspach | ....... | G11C 11/4125 365/154 |
| 7,320,079 B2* | 1/2008 | Suzuki | ................. | G06F 1/3203 713/300 |
| 2006/0152966 A1* | 7/2006 | Park | ...................... | G11C 5/147 365/154 |
| 2007/0090815 A1* | 4/2007 | Hsieh | ...................... | G05F 1/56 323/269 |
| 2016/0036439 A1* | 2/2016 | Douzaka | ............ | H03K 19/0013 327/544 |

OTHER PUBLICATIONS

Qin et. al., Standby supply voltage minimization for deep submicron SRAM, Microelectronics Journal, 2005, pp. 789-800, vol. 36, Elsevier Ltd.
Verma, Analysis Towards Minimization of Total SRAM Energy Over Active and Idle Operating Modes, IEEE Transactions on Very Large Scale Integration Systems, 2010, IEEE.

* cited by examiner

*Primary Examiner* — Terrell S Johnson
(74) *Attorney, Agent, or Firm* — The Noblitt Group, PLLC; Hettie L. Haines

(57) ABSTRACT

Various embodiments of the present technology may comprise a method and apparatus for power management of a memory cell. The memory cell may be configured to operate at various voltage levels to mitigate power dissipation. The memory cell may receive a first voltage level during an active state and receive a second voltage level during an idle state. The active and idle states may be known based on predetermined system parameters. The second voltage level may be selected according to the particular characteristics of the memory cell in order to retain input data.

20 Claims, 6 Drawing Sheets

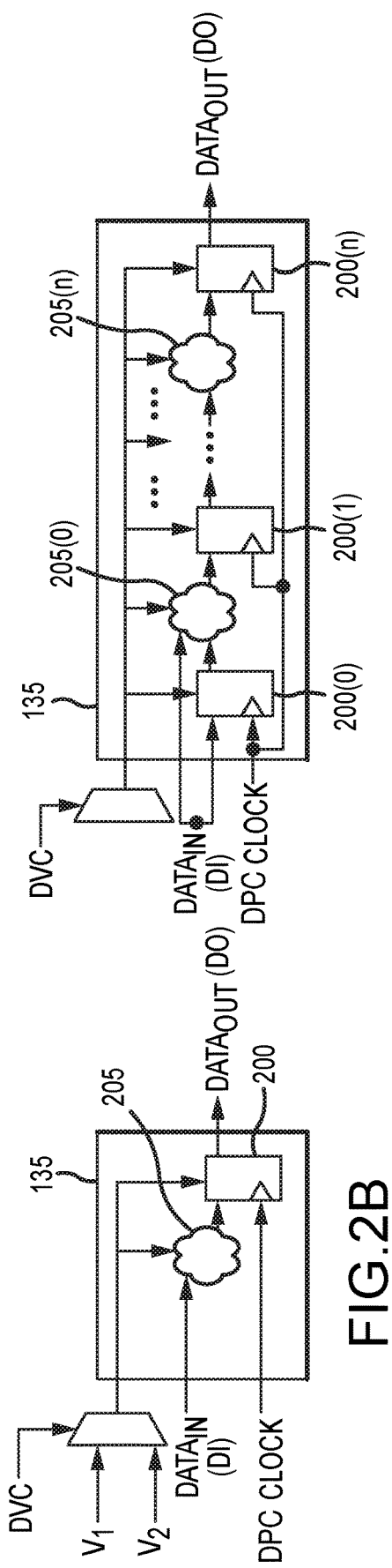
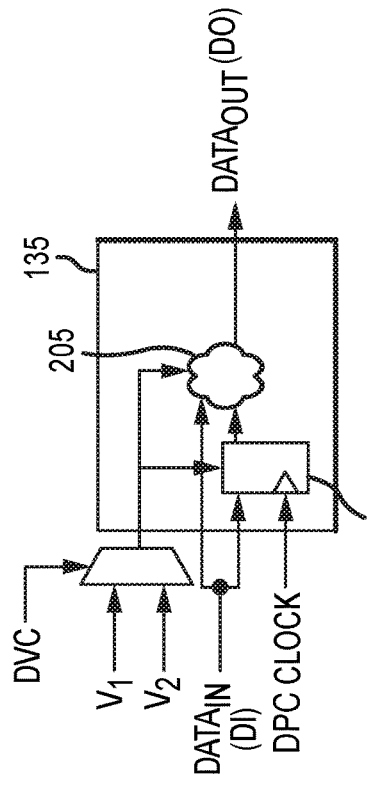
FIG.2B
FIG.2C
FIG.2D dr# METHODS AND APPARATUS FOR POWER MANAGEMENT OF A MEMORY CELL

BACKGROUND OF THE TECHNOLOGY

A System-On-Chip (SOC) typically includes an integrated electronic system on a single integrated circuit (IC) chip. Many SOCs comprise a memory cell, which consume a considerable amount of power compared to other circuits within the SOC. In addition, as transistor size continues to shrink in submicron SOCs, transistor leakage current and leakage power can correspondingly increase leading to an increase in the overall power consumption of the SOC. Many portable and wearable devices have overall low-power consumption requirements due to their small design and small battery component. As such, preventing leakage current and managing power consumption in the circuits that consume the largest percent of the overall power, such as the memory cell, is desired in applications where the battery capacity is small and/or where overall low-power consumption is required.

SUMMARY OF THE INVENTION

Various embodiments of the present technology may comprise a method and apparatus for power management of a memory cell. The memory cell may be configured to operate at various voltage levels to mitigate power dissipation. The memory cell may receive a first voltage level during an active state and receive a second voltage level during an idle state. The active and idle states may be known based on predetermined system parameters. The second voltage level may be selected according to the particular characteristics of the memory cell in order to retain input data.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIGS. 2A-2D are block diagrams of a data processing circuit in accordance with exemplary embodiments of the present technology;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage generators, power supplies, storage devices, logic circuits, processing units, and the like, which may carry out a variety of functions. In addition, the present technology may be practiced in conjunction with any number of systems, such as audio systems, imaging systems, and consumer electronics, and the systems described are merely exemplary applications for the technology. Further, the present technology may employ any number of conventional techniques for receiving data, sampling data, processing data, and the like.

Methods and apparatus for power management of a memory cell according to various aspects of the present technology may operate in conjunction with any suitable electronic system, such as "smart devices," wearables (e.g., wireless earbuds), portable electronics, consumer electronics, and the like. Further, methods and apparatus for power management of a memory cell may be utilized with any suitable system, such as an audio system, a camera system, video system, machine vision, vehicle navigation, surveillance system, motion detection system, and the like.

Figure 1:
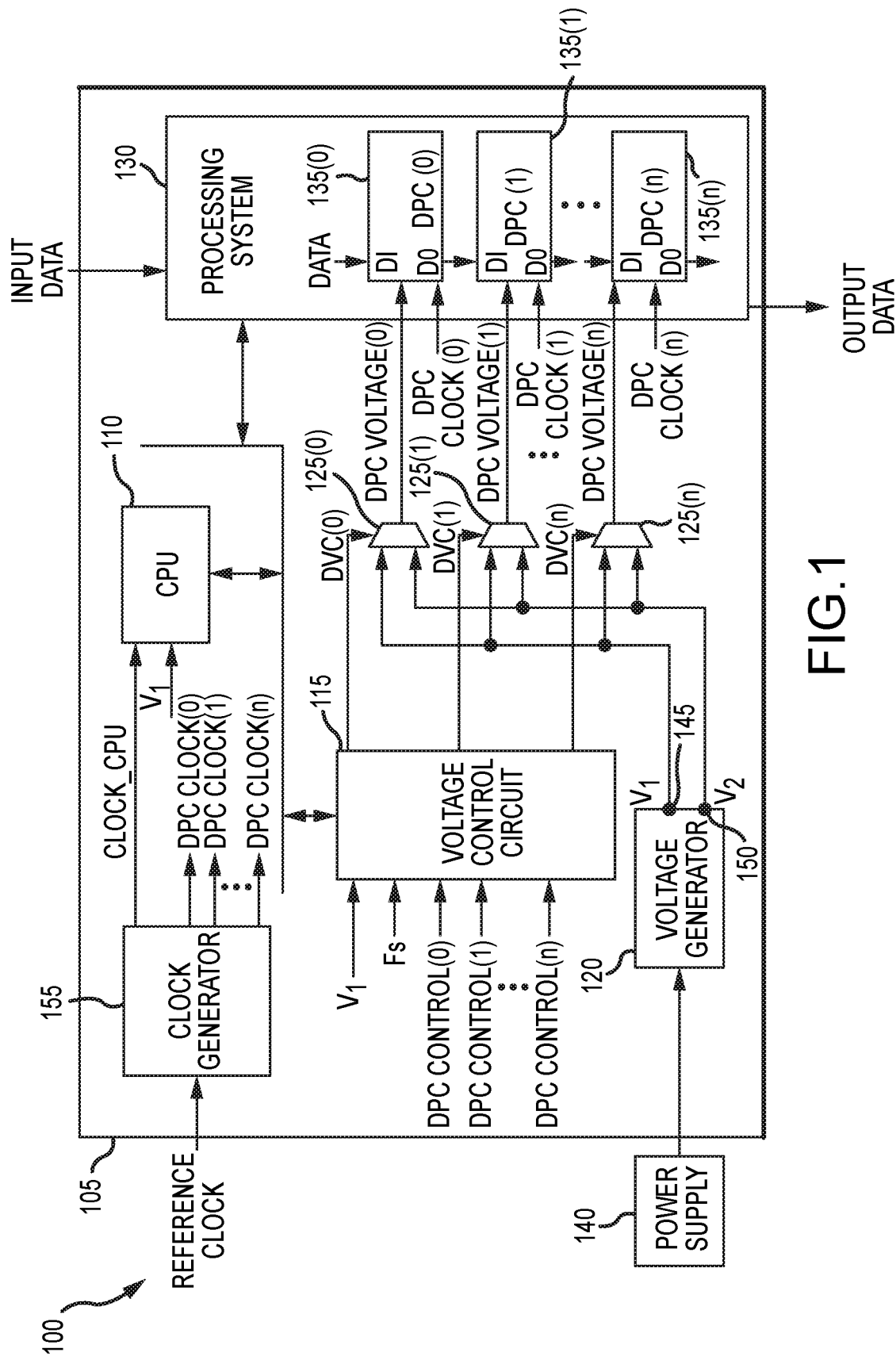
FIG. 1 is a block diagram a system in accordance with an exemplary embodiment of the present technology.
Figure 2A:
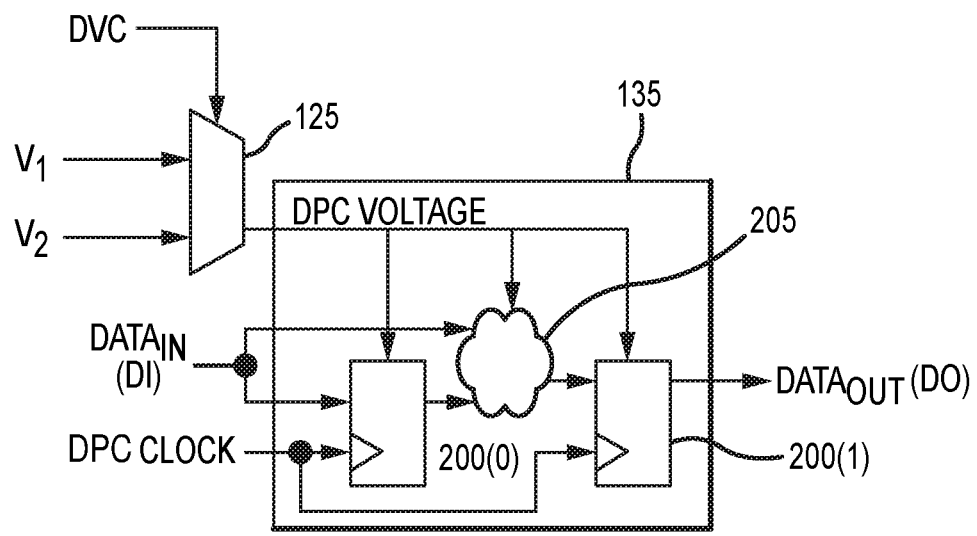

Referring to FIG. 1, an exemplary system 100 may comprise an audio system, such as wireless earbuds. The system 100 may comprise various circuits to receive input data, process the data, and output data. The system 100 may further comprise any suitable power source for supplying power to the various circuits. For example, the system 100 may comprise a power supply 140 and an integrated circuit 105 (i.e., system on a chip).

The power supply 140 may provide power in the form of a voltage supply (or current) to the integrated circuit 105. The power supply 140 may deliver power to the integrated circuit 105 according to the particular application, desired power consumption, and the like. For example, in various embodiments, the power supply 140 may be configured to deliver constant power to the integrated circuit 105. In other embodiments, the power supply 140 may be configured to deliver intermittent power to the integrated circuit 105. The power supply 140 may comprise any suitable type of device or system including a rechargeable power supply, such as a lithium-ion battery or a non-rechargeable power supply, such as a primary cell battery and an external power supply via a power supply port, such as a USB port, USB-C port, and the like. The amount of power that the power supply delivers to the integrated circuit 105 may be regulated according to any desired criteria such as the particular application, power consumption limitations, and the like.

The integrated circuit 105 may be configured to generate various voltages to power various circuits contained within the integrated circuit 105, process data according to the particular application and system integration of the circuit 105, and make decisions according to predefined rules and/or variables. For example, in an exemplary embodiment, the integrated circuit 105 may comprise a clock generator 155, a voltage generator 120, a voltage control circuit 115, a central processing unit (CPU) 110, a selector circuit 125, and a processing system 130. The integrated circuit 105 may further comprise any number of input/output pins for delivering power, receiving input data, or transmitting output data.

The clock generator 155 may comprise any suitable circuit configured to generate one or more clock signals. For example, the clock generator 155 may generate a CPU clock signal (Clock_CPU) and transmit the Clock_CPU to the CPU 110. The clock generator 155 may further generate a DPC clock signal and transmit the DPC clock signal to the processing system 130.

The voltage generator 120 may be configured to generate and output multiple voltage levels simultaneously. For example, the voltage generator 120 may comprise a first output terminal 145 to output a first voltage $V_1$ and a second output terminal 150 to output a second voltage $V_2$. The voltage generator 120 may be coupled to and receive power from the power supply 140. The values of the first voltage $V_1$ and the second voltage $V_2$ may be selected according to the particular application. In various embodiments, the values of the first and second voltages $V_1$, $V_2$ may be selected according to the operating specifications of one or more circuits and/or systems configured to receive the first and second voltages $V_1$, $V_2$. For example, and referring to FIG. 4, according to an exemplary embodiment, the first voltage $V_1$ is selected to fall within a first range R1, wherein the first range is defined by an upper limit (e.g., a maximum voltage $V_{max}$ specification) and a lower limit (e.g., a minimum voltage $V_{min}$ specification) (i.e., $V_{max} > V_1 > V_{min}$), and the second voltage $V_2$ is selected to fall within a second range R2, wherein the second range is defined by an upper limit (e.g., the minimum voltage $V_{min}$ specification) and a lower limit (e.g., a minimum-retention voltage $V_{min\_ret}$ specification) (i.e., $V_{min} > V_2 > V_{min\_ret}$). Therefore, the first voltage $V_1$ is greater than the second voltage $V_2$. In the exemplary embodiment, the maximum voltage $V_{max}$, the minimum voltage $V_{min}$, and the minimum-retention voltage $V_{min\_ret}$ correspond to the operation specifications of the processing system 130.

The voltage control circuit 115 may be configured to receive various input control signals and transmit various output control signals according to the input control signals. The voltage control circuit 115 may be coupled to and receive input control signal from the CPU 110. The input control signals may be configurable and may be based on the particular application of the integrated circuit 105. For example, in the case where the system 100 is an audio system, the CPU 110 may be configured with relevant variables and/or predetermined parameters related to audio processing, such as a sampling frequency Fs, as well as signals corresponding to enabling/disabling selected circuits and/or systems. In an exemplary embodiment, the voltage control circuit 115 may receive the predetermined parameter, such as the sampling frequency Fs, and a data processing circuit (DPC) control signal from the CPU 110. In embodiments where the integrated circuit 105 is incorporated into an audio device and/or system, the sampling frequency Fs may be selected according to a range of human hearing. For example, the sampling frequency Fs may be set to 44.1 KHz (i.e., 44,100 samples per second), wherein signals sampled at this rate can be used to accurately reproduce audio frequencies up to 20,500 Hz, covering the full range of human hearing.

The voltage control circuit 115 may further receive power from the power supply 140 or the voltage generator 120. The voltage control circuit 115 may transmit a dynamic voltage control (DVC) signal to the selector circuit 125 according to the DPC control signal and/or the predetermined parameter. For example, the DVC signal may comprise a logic value (e.g., "1", "0"), wherein the logic value corresponds to one of an enable function or a disable function, and the voltage control circuit 115 may transmit a particular value of the DVC signal according to the input control signals, such as the sampling frequency and the DPC control signal.

The selector circuit 125 may be configured to receive multiple voltages and a control signal, and transmit one of the voltages to the processing system 130 according to the control signal. For example, in the case where the system 100 is an audio system, the selector circuit 125 may receive the DVC signal as the control signal and may receive the first voltage $V_1$ at a first input terminal and a second voltage $V_2$ at a second input terminal. Therefore, the selector circuit 125 may be configured to transmit one of the first or second voltages $V_1$, $V_2$ according to the DVC signal. For example, when the DVC signal is a logic "1," the selector circuit 125 may be configured to transmit the first voltage $V_1$. Similarly, when the DVC signal is a logic "0," the selector circuit 125 may be configured to transmit the second voltage $V_2$. The logic values are arbitrary, as the selector circuit 125 may be configured to respond in a particular way given a particular DVC signal. For example, the selector circuit 125 may comprise a conventional multiplexer with two inputs and one select line.

The processing system 130 may be configured to perform various digital signal processing functions, such as sampling, filtering, and adjusting input data, to increase the quality of output data. For example, the processing system 130 may comprise a data processing circuit (DPC) 135. The processing system 130 may further comprise various interface circuits, such as a CPU interface circuit (not shown), and one more signal conversion circuits (not shown), such as an analog-to-digital converter and a digital-to-analog converter.

Referring to FIGS. 2A-2D, the DPC 135 may facilitate processing functions, logic functions, and/or store data. The DPC 135 may receive the DPC voltage transmitted from the selector circuit 125, as well as a DPC clock signal (DPC CLOCK) from the clock generator 155. The DPC 135 may utilize the DPC voltage to power various components, such as a memory cell 200 and a logic unit 205. Accordingly, the DPC 135 may be configured to route the DPC voltage to the memory cell 200 and the logic unit 205 to provide power to relevant components. According to various embodiments, the DPC 135 may comprise any suitable number of memory cells 200 and logic units 205. The particular number of the memory cells 200 and logic units 205, as well as their arrangement with respect to each other, may be selected according to a particular application, power limitations, physical layout limitations, and the like. The DPC 135 may further be configured to receive input data (DI) and transmit output data (DO).

In various embodiments, the processing system 130 may comprise a plurality of data processing circuits 135(0):135(n), wherein each data processing circuit 135(0):135(n) performs a different function. For example, in the case where the system 100 is an audio system, one data processing circuit 135 may function to equalize an input data signal, while a different data processing circuit 135 may function to cancel noise in the data signal. In such a case, each data processing circuit 135 may operate independently from the other data processing circuits 135. For example, the integrated circuit 105 may comprise a plurality of selector circuits 125(0):125(n), wherein each data processing circuit 135 couples to a dedicated selector circuit 125. The number and particular function of each data processing circuit 135 may be selected according to the particular application.

According to various embodiments, the memory cell 200 may be configured to operate in various states according to the DPC clock signal and/or the predetermined parameter (or variable). For example, the memory cell 200 may operate in an active state, wherein the memory cell 200 is capable of reading data (data has been requested) and writing data (updating the contents), and an idle state, wherein the memory cell 200 is not reading or writing new data, but rather retaining previously-written data. In various embodiments, the memory cell 200 may comprise a retentive memory cell, such as an SRAM, a flip flop, and the like, capable of retaining data during periods of reduced power.

Figure 3:
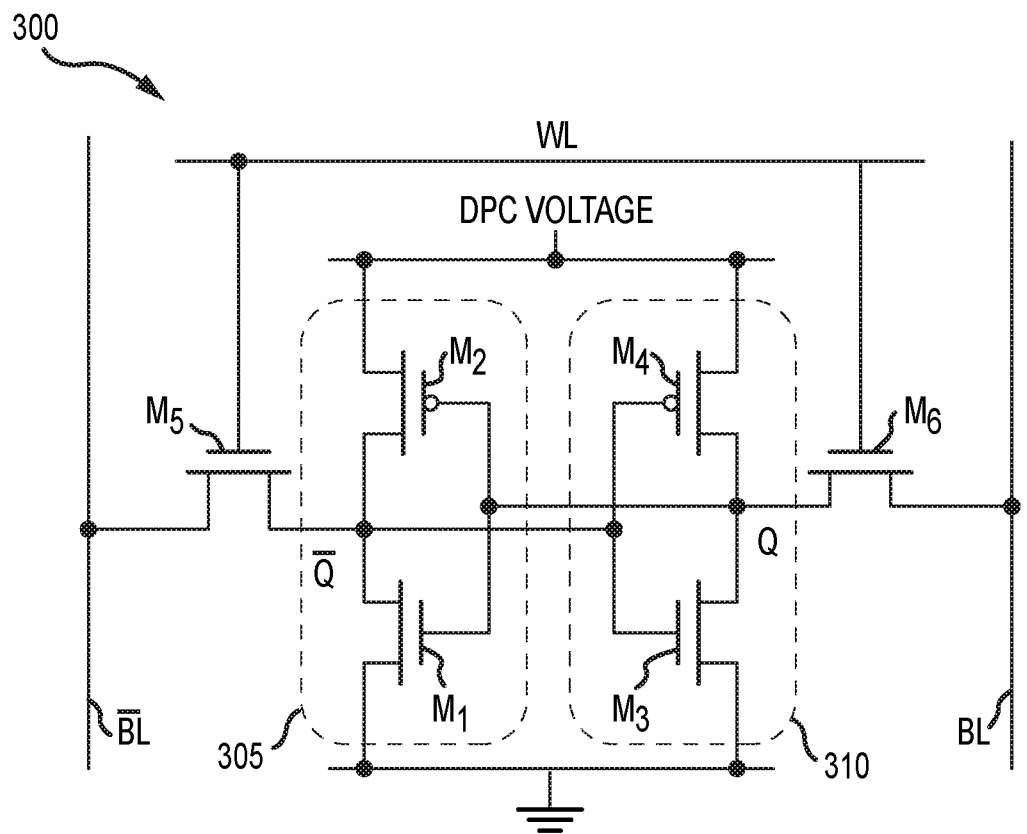
FIG. 3 is a circuit diagram for a memory cell in accordance with an exemplary embodiment of the present technology.

The memory cell 200 may comprise a conventional SRAM array formed on a substrate using conventional components, such as transistors with a gate, a drain, and a source. For example, and referring to FIG. 3, the memory cell 200 (e.g., SRAM array) may comprise a plurality of bit cells, wherein each bit cell 300 comprises two access transistors (M5, M6) and two cross-coupled inverters 305, 310. The memory cell 200 may further be coupled to peripheral control logic to control the state of a given bit cell 300. For example, the control logic may switch the bit cell 300 from the active state to the idle state, or vice versa, through a word line (WL). The SRAM bit cell 300 may be coupled to one or more bit lines (BL, $\overline{BL}$) to transfer data during the active state.

In various embodiments, the memory cell 200 may be further coupled to the clock generator 155 and configured to receive the DPC clock signal. As such, the DPC clock signal may control the timing of switching the state of the memory cell from the active state to the idle state, and vise versa. The DPC clock signal may operate at a frequency (clock frequency) that is a multiple of the predetermined parameter. For example, the clock frequency may be a multiple of the sampling frequency Fs. In audio applications, the clock frequency may be equal to the sampling frequency Fs multiplied by an audio bit depth (resolution), for example $2^8=256$ (i.e., clock frequency=Fs*256).

Figure 4:
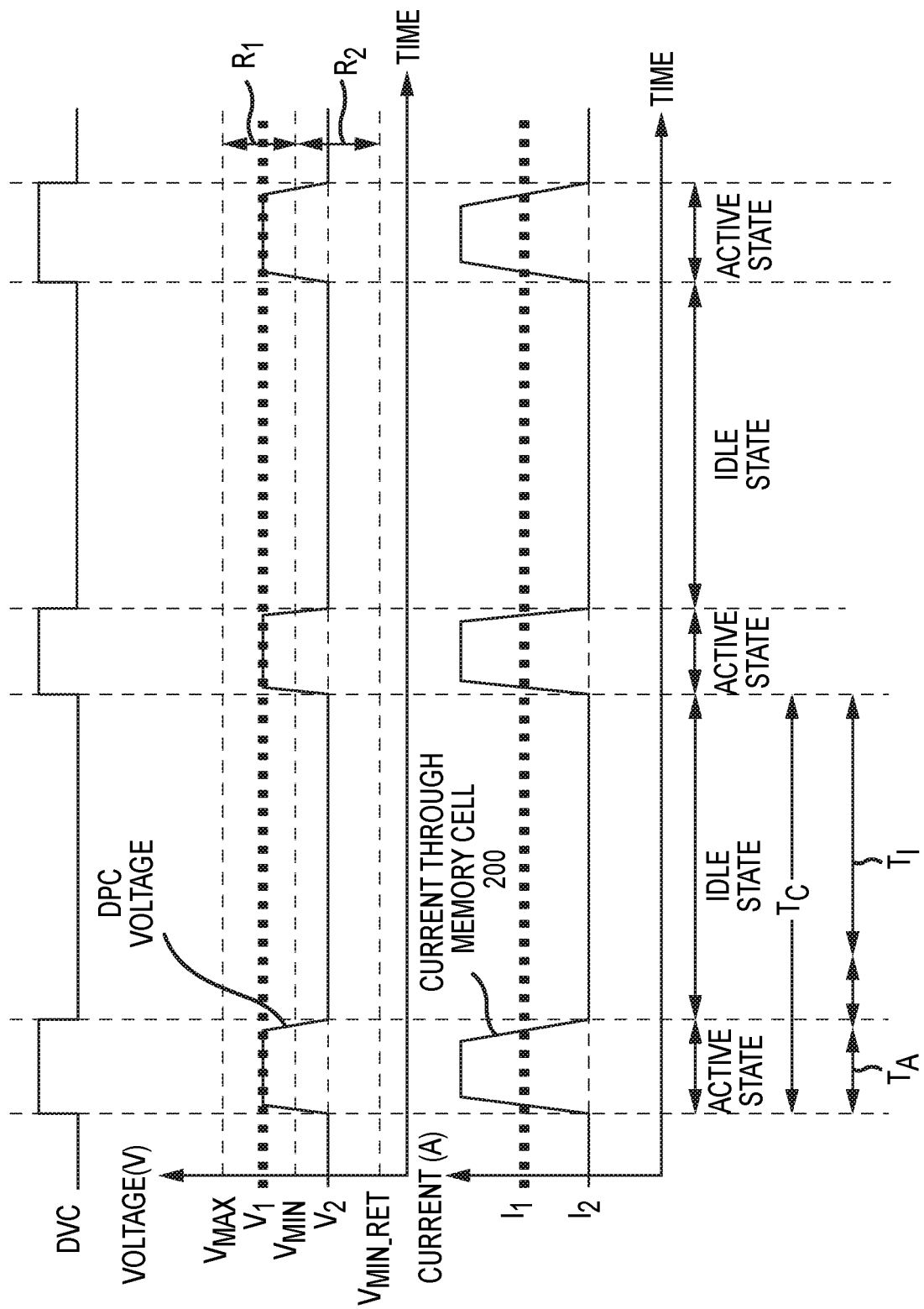
FIG. 4 is an operation timing diagram of a memory cell with one time cycle in accordance with an exemplary embodiment of the present technology.

According to various applications, and referring to FIG. 4, the memory cell operates in the active state for a predetermined period of time (a first time segment $T_A$), and operates in the idle state for a predetermined period of time (a second time segment $T_I$). Similarly, a length of time required to cycle through one active state and one idle state is also a known period of time and referred to as a time cycle Tc. As such, other operations may be timed to occur substantially coincident with the first time segment $T_A$ and the second time segment $T_I$. For example, the voltage generator circuit 115, via the DVC control signal and the selector circuit 125, may selectively couple one of the first voltage $V_1$ or the second voltage $V_2$ (via the DPC voltage signal) to the memory cell 200 at substantially the same time as the memory cell 135 is switching from the active state to the idle state, or vise versa. In an exemplary embodiment, the selector circuit 125 is configured to couple the first voltage $V_1$ to the memory cell 200 substantially coincident with the active state (the first time segment), and to couple the second voltage $V_2$ to the memory cell 200 substantially coincident with the idle state (the second time segment). Reducing the voltage to the memory cell 200 during the idle state may reduce leakage current in the data processing circuit 135 and/or memory cell 200 and, therefore, reduce the overall power consumption of the system 100.

Figure 5:
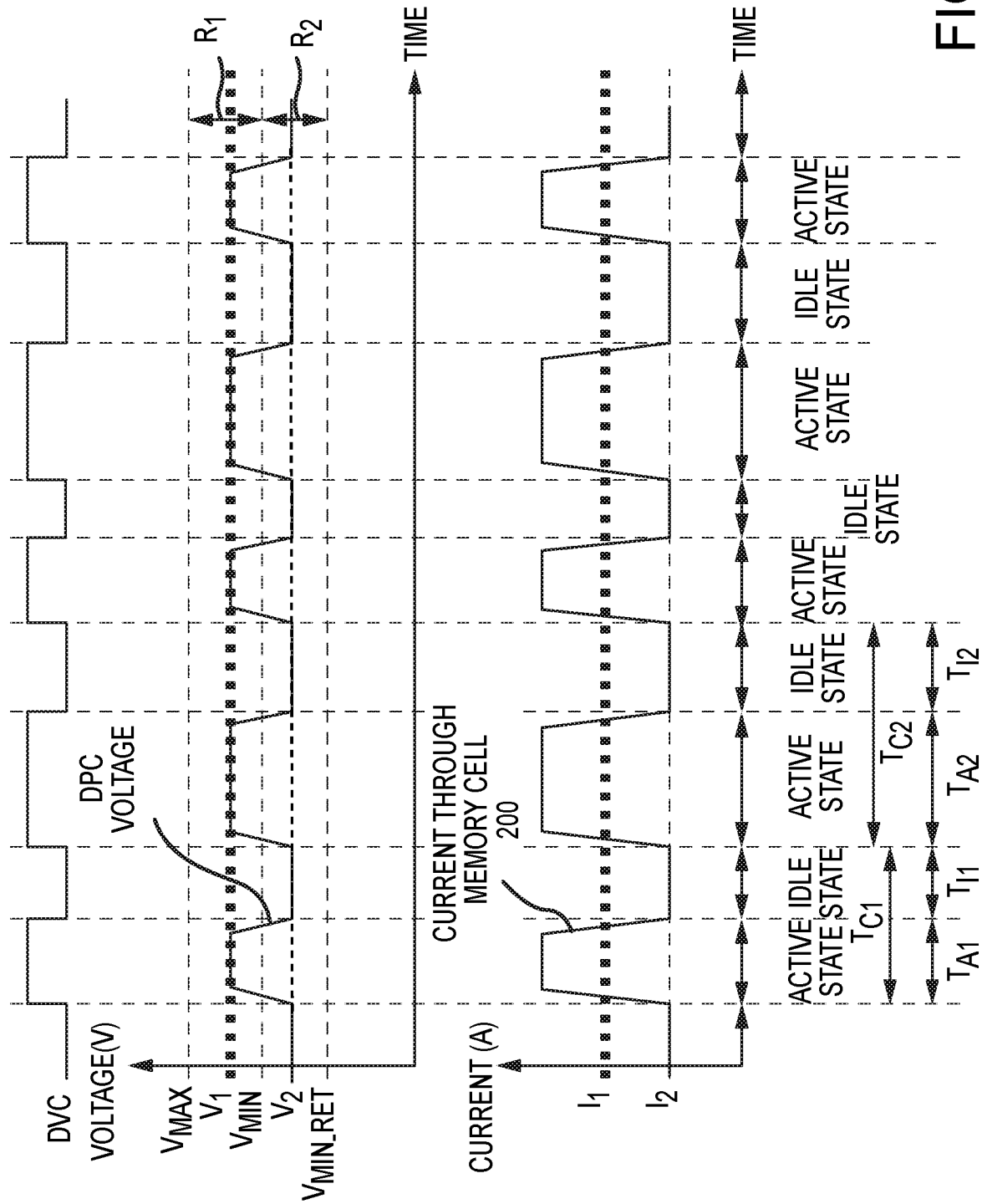
FIG. 5 is an operation timing diagram of a memory cell with two different time cycles in accordance with an exemplary embodiment of the present technology.

In other embodiments, and referring to FIG. 5, the memory cell 200 may operate according to multiple time cycles. For example, the memory cell 20 may operate according to a first time cycle $T_{c1}$ and a second time cycle $T_{c2}$, wherein the length of time of the first time cycle $T_{c1}$ is different than the length of time of the second time cycle $T_{c2}$. According to the present embodiment, the first time cycle $T_{c1}$ may comprise a first active state $T_{A1}$ and a first idle state $T_{I1}$, and the second time cycle $T_{c2}$ may comprise a second active state $T_{A2}$ and a second idle state $T_{I2}$. In an exemplary embodiment, the second active state $T_{A2}$ may be greater in length of time than the first active state $T_{A1}$. In various embodiments, first time cycle $T_{c1}$ and the second time cycle $T_{c2}$ may alternate. As described above, other operations may be timed to occur substantially coincident with the first active state $T_{A1}$, the first idle state $T_{I1}$, the second active state $T_{A2}$, and the second idle state $T_{A2}$ as the length of time of first and second time cycles $T_{c1}$, $T_{c2}$, and their respective active and idle states, are known. The number of time cycles may be selected according to the particular application.

The logic circuit 205 may be configured to provide control signals to one or more memory cells 200. The logic circuit 205 may operate in conjunction with peripheral devices and/or systems, such as the CPU 110, to control the state of the memory cell 200. The logic circuit 205 may comprise any number of logic gates, adders, digital components, and the like, and may be configured to perform various functions according to the particular application.

In operation, the integrated circuit 105 operates to reduce overall power consumption by limiting the power (voltage or current) to various components of the system during specified time periods. The specified time periods coincide with particular operating states of the data processing circuit 135 and/or the memory cell 200. According to various embodiments, the data processing circuit 135 and/or memory cell 200 are able to retain data during a period reduced voltage and/or power.

In an exemplary embodiment, and referring to FIGS. 1, 2A-2D, and 4, the CPU 110 may transmit the sampling frequency Fs and the DPC control signal to the voltage control unit 115. The voltage control unit 115 may utilize the sampling frequency Fs and the DPC control signal to determine the appropriate value of the DVC signal. For example, the value of DVC signal may be a logic 1 or a logic 0, wherein each logic value represents a particular instruction.

The power supply 140 may supply power to the voltage generator 120, wherein the voltage generator 120 generates and outputs the first voltage $V_1$ and the second voltage $V_2$ substantially simultaneously. The voltage generator 120 transmits both the first voltage $V_1$ and the second voltage $V_2$ to the selector circuit 125.

The selector circuit 125 receives both the first and second voltages $V_1$, $V_2$, as well as the DVC signal, and the selector circuit 125 selects and transmits one of the first and second voltages to the processing system 130 based on the value (instruction) of the DVC signal. For example, if the DVC value is a logic 1, then the selector circuit 125 may select and output the first voltage $V_1$, and the if the DVC value is a logic 0, then the selector circuit 125 may select and output the second voltage $V_2$. As such, the DPC voltage signal may take the form of the first voltage $V_1$ or the second voltage $V_2$.

Since the active state and the idle state, and their respective time periods $T_A$, $T_I$, are known, the DVC signal may also be transmitted substantially coincident with the first time segment $T_A$ and the second time segment $T_I$ (and the active state and the idle state). In various embodiments, the active state and the first time segment may be based on the DPC clock signal (DPC clock frequency $F_{aud}$).

In an exemplary embodiment, the DPC clock frequency may be set according to the sampling frequency Fs, for example 44.1 KHz, wherein the DPC clock frequency $F_{aud}$ is equal to the bit resolution (e.g., 256) multiplied by the sampling frequency Fs (i.e., $F_{aud}=Fs*256$). The first time segment $T_A$ may be equal to an inverse of the DPC clock frequency (i.e., $T_A=1/F_{aud}=1/(Fs*256)$). For example, where the sampling frequency Fs is set to 44.1 KHz, the first time segment is equal to approximately 88.6 ns (nanoseconds), and the time cycle Tc is equal to approximately 22.6757 μs (microseconds).

In an exemplary embodiment, the time cycle Tc, which includes one active state and one idle state, is also known and is equal to an inverse of the sampling frequency (or other predetermined parameter). Therefore, the second time segment $T_1$ is equal to a difference of the time cycle Tc and the first time segment $T_A$.

During the first time segment $T_A$, when the memory cell 200 is in the active state, the voltage control circuit 115, DVC signal, and selector circuit 125 together, facilitate transmission of the first voltage $V_1$ to the memory cell 200. The high voltage level results in a high current $I_1$ through the memory cell 200. During the second time segment $T_1$, when the memory cell 200 is in the idle state, the voltage control circuit 115, the DVC signal, and the selector circuit 125 together, facilitate transmission of the second voltage $V_2$ to the memory cell 200. The lower voltage level results in a lower current $I_2$ through the memory cell 200, and thus reduces the leakage current for a large portion of the time cycle Tc. By reducing the leakage current during the idle state, power loss is mitigated. In addition, since the second voltage $V_2$ is selected to allow the memory cell 200 to retain its data, switching back to the active state after the idle state provides an increased data processing rate compared to existing systems where the power to the memory cell 200 is completely shut off during idle states.

According to an embodiment where the processing system 130 comprises the plurality of DPC circuits 135(0):135(*n*) and the plurality of selector circuits 125(0):125(*n*), each DPC circuit 135 may operate independently from the other DPC circuits 135 by utilizing a dedicated selector circuit 125. For example, a first DPC circuit 135(0) may receive the first voltage $V_1$ via a first selector circuit 125(0), while a second DPC circuit 135(1) is receiving the second voltage $V_2$ via a second selector circuit 125(1). In this way, power consumption may be optimized by increasing the number of memory cells 200 that may be placed into an idle state during operation. The particular timing of DPC voltages may be based on the respective DPC clock signals (DPC clock(0):(n)), the respective DPC control signals (DPC control(0):(n)), particular application, desired power consumption, and the like.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An integrated circuit, comprising:
    a voltage generator configured to generate a first voltage and a second voltage;
    a voltage control circuit configured to generate a voltage control signal according to a predetermined parameter;
    a data processing circuit, coupled to the voltage control circuit and the voltage generator, comprising a memory cell, wherein the memory cell is configured to operate:
        in an active state and in an idle state according to a predetermined time cycle, the predetermined time cycle comprising a first time segment and a second time segment; and
        according to a clock frequency, wherein the clock frequency is a multiple of the predetermined parameter;
    a selector circuit, coupled between the voltage control circuit and the data processing circuit and responsive the voltage control signal, wherein:
        the selector circuit is configured to selectively couple one of the first and the second voltage to the memory cell;
        the voltage control circuit transmits the voltage control signal to the selector circuit according to the first time segment and the second time segment;
        the first voltage is coupled to the memory cell substantially coincident with the active state; and
        the second voltage is coupled to the memory cell substantially coincident with the idle state.

2. The integrated circuit according to claim 1, wherein the predetermined time cycle is equal to an inverse of the predetermined parameter.

3. The integrated circuit according to claim 1, wherein the first time segment is equal to an inverse of the clock frequency.

4. The integrated circuit according to claim 3, wherein the second time segment is equal to a difference of the predetermined time cycle and the first time segment.

5. The integrated circuit according to claim 1, wherein:
during the first time segment, the memory cell operates in the active state; and
during the second time segment, the memory cell operates in the idle state.

6. The integrated circuit according to claim 1, wherein when the memory cell operates in the active state, the memory cell is capable of reading and writing data; and
when the memory cell operates in the idle state, the memory cell is:
capable of retaining previously-written data; and
incapable of reading and writing new data.

7. The integrated circuit according to claim 1, wherein:
the control circuit couples the first voltage to the memory cell during the first time segment; and
the control circuit couples the second voltage to the memory cell during the second time segment.

8. The integrated circuit according to claim 1, wherein:
the predetermined parameter is a sampling frequency; and
the sampling frequency is selected according to a range of human hearing.

9. The integrated circuit according to claim 1, wherein:
the first voltage is less than a maximum operating voltage of the memory cell and greater than a minimum operating voltage of the memory cell; and
the second voltage is less than the minimum operating voltage of the memory cell and greater than a minimum retention voltage of the memory cell.

10. A method for operating a system with a plurality of memory cells, comprising:
generating a clock signal with a clock frequency based on a sampling frequency;
generating a first voltage and a second voltage with a voltage generator;
simultaneously outputting, with the voltage generator, the first voltage at a first output terminal and the second voltage at a second output terminal;
selectively coupling the first voltage to at least one memory cell from the plurality of memory cells during an active state; and
selectively coupling the second voltage to at least one memory cell from the plurality of memory cells during an idle state;
wherein:
during a predetermined time cycle, the plurality of memory cells operate in the active state and the idle state; and
the predetermined time cycle is equal to an inverse of the sampling frequency.

11. The method for operating a system according to claim 10, wherein:
the first voltage is less than a maximum operating voltage of the plurality of memory cells and greater than a minimum operating voltage of the plurality of memory cells; and
the second voltage is less than the minimum operating voltage of the plurality of memory cells and greater than a minimum retention voltage of the plurality of memory cells.

12. The method for operating a system according to claim 10, wherein
the plurality of memory cells operate in the active state during a first predetermined time segment;
the plurality of memory cells operate in the idle state during a second predetermined time segment; and
the sum of the first predetermined time segment and the second predetermined time segment is equal to the predetermined time cycle.

13. The method for operating a system according to claim 12, the first predetermined time segment is equal to the inverse of the clock frequency.

14. The method for operating a system according to claim 10, wherein the sampling frequency is selected according to a range of human hearing.

15. An audio system capable of receiving power from a power supply, comprising:
a CPU configured to generate a clock signal having a clock frequency based on a sampling frequency, wherein the sampling frequency is selected according to a range of human hearing;
a voltage control circuit coupled to the CPU and configured to:
receive the sampling frequency; and
output a voltage control signal according to the sampling frequency;
a voltage generator configured to:
couple to the power supply; and
generate:
a first voltage at a first output; and
a second voltage at a second output;
a selector circuit coupled to an output of the voltage control circuit and the first and second outputs of the voltage generator, wherein the selector circuit selectively outputs, at an output terminal, one of the first voltage and the second voltage according to the voltage control signal; and
a processing system coupled to the output terminal of the selector circuit, comprising a plurality of data processing circuits, each comprising a memory cell configured to operate in an active state and in an idle state, wherein the selector circuit outputs:
the first voltage substantially coincident with the active state; and
the second voltage substantially coincident with the idle state.

16. The audio system according to claim 15, wherein:
the voltage control signal comprises a first control signal and a second control signal; and
the voltage control circuit outputs:
the first control signal for a first predetermined time segment; and
the second control signal for a second predetermined time segment.

17. The audio system according to claim 16, wherein:
a sum of the first and second time segments equal a predetermined time cycle; and
the time cycle is equal to an inverse of the sampling frequency.

18. The audio system according to claim 16, wherein the first predetermined time segment is equal to an inverse of the clock frequency.

19. The audio system according to claim 16, wherein:
during the first predetermined time segment, the memory cell operates in the active state and the selector circuit couples the first voltage to the memory cell; and
during the second predetermined time segment, the memory cell operates in the idle state and the selector circuit couples the second voltage to the memory cell.

20. The audio system according to claim 15, wherein:
when the memory cell operates in the active state, the memory cell is capable of reading and writing data; and
when the memory cell operates in the idle state, the memory cell is:
   capable of retaining previously-written data; and
   incapable of reading and writing new data.

\* \* \* \* \*